United States Patent
Park (10) Patent No.: US 7,183,810 B2
(45) Date of Patent: Feb. 27, 2007

(54) CIRCUIT AND METHOD FOR DETECTING PHASE

(75) Inventor: Kwang-Il Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 18 days.

(21) Appl. No.: 11/188,952

(22) Filed: Jul. 25, 2005

(65) Prior Publication Data

US 2006/0022717 A1    Feb. 2, 2006

(30) Foreign Application Priority Data

Jul. 27, 2004    (KR) .................. 10-2004-0058594

(51) Int. Cl.
    *H03L 7/08*    (2006.01)
(52) U.S. Cl. ............................... 327/2; 327/47
(58) Field of Classification Search .............. 327/2, 327/3, 12, 39, 40, 43, 47, 49
    See application file for complete search history.

(56) References Cited

U.S. PATENT DOCUMENTS

2005/0007154 A1* 1/2005 Patella et al. ............... 327/2
2006/0055434 A1* 3/2006 Tak et al. ................... 327/47

FOREIGN PATENT DOCUMENTS

| JP | 63-11869 | 1/1988 |
| JP | 5-191276 | 7/1993 |
| JP | 2002-111485 | 4/2002 |

OTHER PUBLICATIONS

Young-Soo Sohn et al., "A 1.35Gbps Decision Feedback Equalizing Receiver for the SSTL SDRAM Interface with 2X Oversampling Phase Detector for Skew Compensation between Clock and Data," Pohang University of Science and Technology, Pohang, Korea, Sep. 24-26, 2002, IEEE Solid-State Circuits Conference.*

* cited by examiner

Primary Examiner—Michael B. Cleveland
Assistant Examiner—Colleen O'Toole
(74) Attorney, Agent, or Firm—Mills & Onello LLP (57) ABSTRACT

A circuit for detecting phase includes a first inverter, a second inverter, a differential amplifier, an output load latch and an output latch. The first and second inverters receive an input signal and an inverted input signal to generate first and second differential input signals in response to a clock signal and first and second control signals, respectively, and shut off transmissions of the input signal and the inverted input signal. The differential amplifier differentially amplifies the first and second differential input signals in response to the clock signal to provide first and second differential output signals as the first and second control signals. The output load latch latches the first and second differential output signals to generate the first and second latch output signals. The output latch latches the first and second latch output signals to output a phase detection signal.

16 Claims, 6 Drawing Sheets

CIRCUIT AND METHOD FOR DETECTING PHASE

CLAIM FOR PRIORITY

This application claims priority under 35 USC § 119 to Korean Patent Application No. 2004-58594, filed on Jul. 27, 2004, the contents of which are herein incorporated by reference in their entirety for all purposes.

BACKGROUND OF THE INVENTION

1. Field of the Invention

The present invention relates to a phase detector circuit and method, and more particularly to a phase detector circuit and method, which have a reduced variation in a phase offset caused by variations in an input signal and external conditions.

2. Description of the Related Art

A delay locked loop (DLL) or a phase locked loop (PLL) includes a phase detector for detecting a phase difference between an internal clock signal and an external clock signal provided thereto. The delay locked loop (DLL) is used in memory devices such as a synchronous dynamic random access memory (SDRAM).

Generally, the semiconductor device operates at a frequency higher than a frequency of an external clock signal so that the semiconductor device generates the internal clock signal having a frequency higher than that of the external clock signal. During the process, a phase error from the desired clock signal may be generated. Therefore, in a digital signal transmission using binary coded clock signals, a logic value (for example, low logic level or high logic value) of the input signal should be determined.

The phase detector is used to detect the phase error, that is, a phase difference between two input signals, to generate a clock signal corresponding to the phase difference. Two input signals include a reference signal and a remaining signal. One of the two input signals may be used as the reference signal and be compared with the remaining signal. The clock signal generated when the remaining signal transitions earlier than the reference signal has an inverted phase with respect to that of the clock signal generated when the reference signal transitions earlier than the remaining signal.

Figure 1:
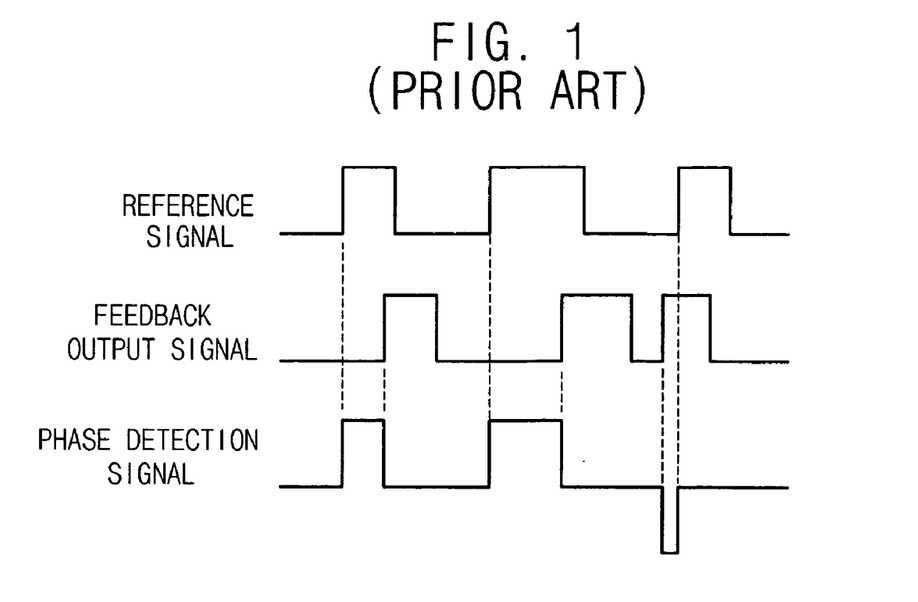
FIG. 1 is a waveform diagram illustrating operation of a phase detector.

FIG. 1 is a waveform diagram illustrating operation of a phase detector.

The phase detector in FIG. 1 is used to detect the phase difference between two received frequencies. With reference to the waveform shown in FIG. 1, a phase detection signal having a pulse width dependent on the phase difference between the two input signals (reference signal and feedback output signal) is outputted. While the magnitude of the pulse is invariable, the pulse width of the phase detection signal is varied according to the phase difference between the two input signals. Additionally, the sign of the phase detection signal is reversed when a sequence of a signal transition (for example, rising transition) for the two input signals changes. Thus, a quantitative amount of phase difference between a present output signal and a desired output signal may be detected.

Figure 2:
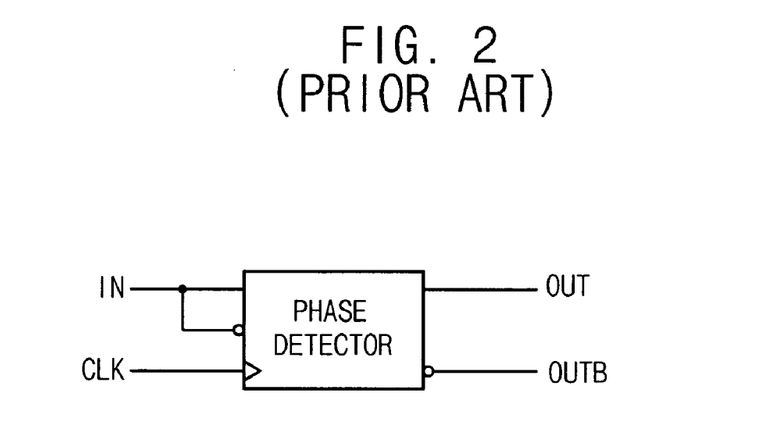
FIG. 2 is a block diagram illustrating a conventional phase detector.

FIG. 2 is a block diagram illustrating a conventional phase detector.

Referring to FIG. 2, the conventional phase detector receives an input signal IN and an inverted input signal INB and detects a phase difference between the input signal IN and a clock signal CLK to generate a phase detection signal OUT and an inverted phase detection signal OUTB.

Figure 3:
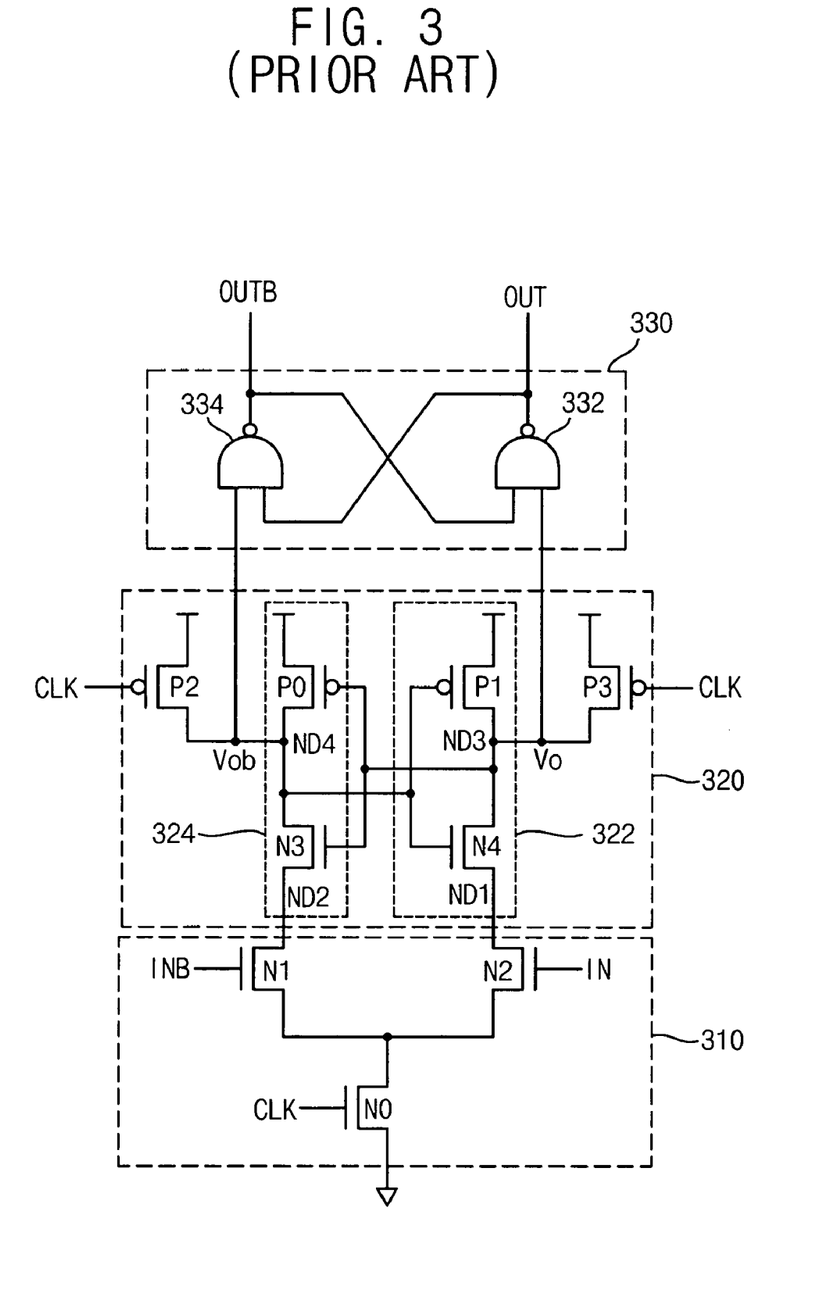
FIG. 3 is a circuit diagram illustrating the conventional phase detector.

FIG. 3 is a circuit diagram illustrating the conventional phase detector.

Referring to FIG. 3, the conventional phase detector includes a differential amplifier 310, an output load latch 320 and an output latch 330.

The differential amplifier 310 differentially amplifies a phase difference between a first node ND1 and a second node ND2. When a clock signal CLK has a logic low level, voltages at the first and second nodes ND1 and ND2 are forced to high voltage levels by a power supply voltage. When the clock signal CLK has a logic high level, an NMOS transistor N0 of the differential amplifier 310 is turned on. Based on the input signal IN and the inverted input signal INB, either an NMOS transistor N1 or an NMOS transistor N2 is turned on so that a predetermined potential difference is applied between the first and second nodes ND1 and ND2.

The output load latch 320 includes a first CMOS inverter 322 connected to the first node ND1 and a second CMOS inverter 324 connected to the second node ND2. An output voltage Vo of the first CMOS inverter 322 is applied to the second CMOS inverter 324 and an output voltage Vob of the second CMOS inverter 324 is applied to the first CMOS inverter 322. Thus, the first and second CMOS inverters 322 and 324 are cross-coupled to each other.

In the case in which the clock signal CLK has a logic high level, the first CMOS inverter 322 outputs the voltage Vo having a logic low level when the input signal IN has a logic high level. The voltage Vo having a logic low level is applied to a gate electrode of a PMOS transistor P0 of the second CMOS inverter 324, thereby turning on the PMOS transistor P0. Therefore, the output voltage Vob having an increased voltage level is outputted from the second CMOS inverter 324 and provided to the output latch 330.

In the case in which the clock signal CLK has a logic high level, the second CMOS inverter 324 outputs the voltage Vob having a logic low level when the inverted input signal INB has a logic high level. The voltage Vob having a logic low level is applied to a gate electrode of a PMOS transistor P1 of the first CMOS inverter 322, thereby turning on the PMOS transistor P1. Therefore, the output voltage Vo having an increased voltage level is outputted from the first CMOS inverter 322 and provided to the output latch 330. The output voltage Vo of the first CMOS inverter 322 and the output voltage Vob of the second CMOS inverter 324 are provided to the output latch 330. Since the input signal IN and the inverted signal INB are concurrently inputted to the first and second CMOS inverters 322 and 324, respectively, the output voltages Vo and Vob of the first and second CMOS inverters 322 and 324 have logic levels opposite to each other when the clock signal CLK has a logic high level.

The output latch 330 latches the output voltages Vo and Vob provided from the first and second CMOS inverters 322 and 324. Particularly, the output latch 330 includes two NAND gates 332 and 334 that are cross-coupled to each other. That is, an output of the NAND gate 332 is provided to the NAND gate 334 and an output of the NAND gate 334 is provided to the NAND gate 332. The output latch 330 latches the output voltage Vo of the first CMOS inverter 322 and the output voltage Vob of the second CMOS inverter 324 to provide phase detection signals OUT and OUTB.

Figure 4:
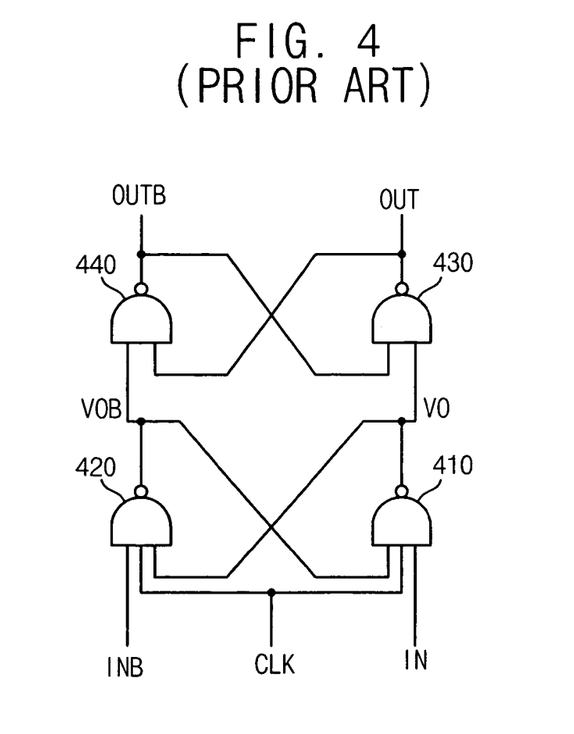
FIG. 4 is an exemplary logic circuit illustrating the conventional phase detector of FIG. 3.

FIG. 4 is an exemplary logic circuit illustrating the conventional phase detector of FIG. 3.

Referring to FIG. 4, the conventional phase detector includes a NAND gate 410 and a NAND gate 420. The NAND gate 410 receives the clock signal CLK, the input signal IN and an output VOB of the NAND gate 420. The NAND gate 420 receives the clock signal CLK, the inverted input signal INB and an output VO of the NAND gate 410. The conventional phase detector further includes a NAND gate 430 and a NAND gate 440. The NAND gate 430 receives the output VO of the NAND gate 410 and an output OUTB of the NAND gate 440, and the NAND gate 440 receives the output VOB of the NAND gate 420 and an output OUT of the NAND gate 430. That is, the NAND gates 410 and 420 are cross coupled to each other and the NAND gates 430 and 440 are cross coupled to each other.

When the clock signal CLK has a logic low level, the outputs Vo and Vob of the NAND gates 410 and 420 constantly have logic high levels. The NAND gates 430 and 440 latch the logic levels of the outputs Vo and Vob and output the logic values of the outputs Vo and Vob stored at a previous clock as the phase detection signals OUT and OUTB, respectively.

When the clock signal CLK has a logic high level, the voltage levels of the output voltages Vo and Vob are determined based on the logic levels of the input signal IN and the inverted input signal INB in the same manner as described above in FIG. 3. The voltage levels of the output voltages Vo and Vob are provided to the NAND gates 430 and 440, respectively, to generate the phase detection signals OUT and OUTB.

When the phase detector circuit is used in the delay locked loop (DLL), an offset should be extremely small and less sensitive to variations of the input signal and external conditions so as to prevent reduction in yield and degradation in performance. However, the conventional phase detector circuit causes the variation in the output signals OUT and OUTB according to the variation in the input signals IN and INB when the clock signal CLK transitions from a logic low level to a logic high level or vice versa.

In addition, when the transition of the input signal occurs concurrently with the transition of the clock signal CLK, the variation of the output signal of the phase detector becomes unpredictable.

In addition, the output signal of the phase detector may be varied according to a threshold voltage of the input signal due to the sensitivity to variations in manufacturing process, temperature, operating voltage, etc.

SUMMARY OF THE INVENTION

Accordingly, the present invention is provided to substantially obviate one or more problems due to limitations and disadvantages of the related art.

According to a first aspect, the invention is directed to a circuit for detecting phase. A first inverter of the circuit is configured to invert an input signal in response to a clock signal and a first control signal to generate a first differential input signal and to shut off a transmission of the input signal. A second inverter is configured to invert an inverted input signal in response to the clock signal and a second control signal to generate a second differential input signal and to shut off a transmission of the inverted input signal. A differential amplifier is configured to differentially amplify the first and second differential input signals in response to the clock signal to provide first and second differential output signals as the first and second control signals. An output load latch is configured to latch the first and second differential output signals to generate the first and second latch output signals. An output latch is configured to latch the first and second latch output signals to output a phase detection signal.

In one embodiment, the first inverter inverts the input signal when the clock signal has a first level to provide the first differential input signal to the differential amplifier, and the first inverter provides the first differential input signal having a predetermined level at a previous clock and shuts off the transmission of the input signal when the clock signal has a second level.

In one embodiment, the first inverter includes: a first PMOS transistor that is activated in response to the first level of the clock signal; a first NMOS transistor serially coupled to the first PMOS transistor that is activated in response to the first control signal; and a second NMOS transistor serially coupled to the first NMOS transistor that is activated in response to the input signal.

In one embodiment, the first differential input signal corresponds to a voltage level at a node coupled between the first PMOS transistor and the first NMOS transistor.

In one embodiment, the second inverter inverts the inverted input signal based on the clock signal having a first level and the second control signal to provide the second differential input signal to the differential amplifier, and the second inverter provides the second differential input signal having a predetermined level at a previous clock and shuts off the transmission of the inverted input signal when the clock signal has a second level. In one embodiment, the second inverter includes: a second PMOS transistor that is activated in response to the first level of the clock signal; a third NMOS transistor serially coupled to the second PMOS transistor that is activated in response to the second control signal and a fourth NMOS transistor serially coupled to the third NMOS transistor that is activated in response to the inverted input signal. In one embodiment, the second differential input signal corresponds to a voltage level at a node coupled between the second PMOS transistor and the third NMOS transistor.

In one embodiment, the differential amplifier includes a bias current source that is activated in response to a first level of the clock signal.

In one embodiment, the output load latch includes a first CMOS inverter and a second CMOS inverter cross coupled to the first CMOS inverter.

In one embodiment, the output latch includes a first NAND gate and a second NAND gate cross coupled to the first NAND gate.

In accordance with another aspect, the invention is directed to a method of detecting phase. The method includes: inverting an input signal in response to a clock signal and a first control signal to generate a first differential input signal and shutting off a transmission of the input signal; inverting an inverted input signal in response to the clock signal and a second control signal to generate a second differential input signal and shutting off a transmission of the inverted signal; differentially amplifying the first and second differential input signals in response to the clock signal to provide first and second differential output signals as the first and second control signals; latching the first and second differential output signals to generate the first and second latch output signals; and latching the first and second latch output signals to output a phase detection signal.

In one embodiment, the inverting an input signal includes: inverting the input signal in response to the clock signal having a first level to provide the first differential input signal; and providing the first differential input signal having a predetermined level at a previous clock and shutting off the transmission of the input signal in response to the clock signal having a second level.

In one embodiment, the inverting an inverted input signal includes: inverting the inverted input signal in response to the clock signal having a first level to provide the second differential input signal; and providing the second differential input signal having a predetermined level at a previous clock and shutting off the transmission of the inverted input signal in response to the clock signal having a second level.

In one embodiment, the differentially amplifying the first and second differential input signals includes: providing the first and second differential output signals as the first and second control signals when the clock signal has a first level; and providing the first and second differential output signals having inactive states as the first and second control signals when the clock signal has a second level.

In one embodiment, the latching the first and second differential output signals includes providing the first latch output signal as an input signal for generating the second latch output signal and providing the second latch output signal as an input signal for generating the first latch output signal in response to the clock signal.

In one embodiment, the latching the first and second latch output signals to output a phase detection signal includes: performing a logical operation on the first latch output signal and the phase detection signal to generate an inverted phase detection signal; and performing a logical operation on the second latch output signal and the inverted phase detection signal to generate the phase detection signal.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE EXEMPLARY EMBODIMENTS

Hereinafter, the present invention will be described in detail with reference to the accompanying drawings.

Figure 5:
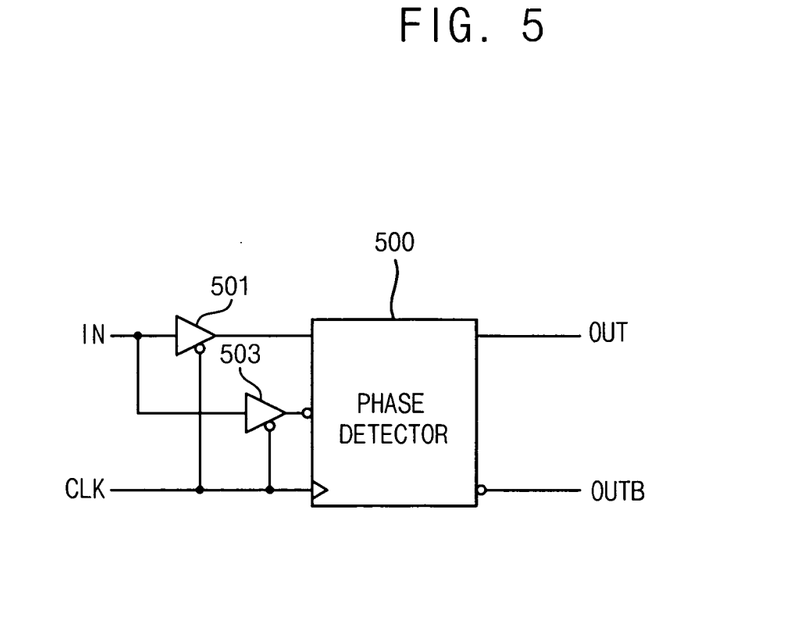
FIG. 5 is a block diagram illustrating a phase detector according to an exemplary embodiment of the present invention.

FIG. 5 is a block diagram illustrating a phase detector according to an exemplary embodiment of the present invention.

Referring to FIG. 5, the phase detector according to exemplary embodiments of the present invention receives an input signal IN and an inverted input signal INB via tri-state buffers 501 and 503, respectively, controlled by a clock signal CLK. When the clock signal CLK is changed to a logic high level, the tri-state buffers 501 and 503 stop operating so that transmissions of the input signal IN and the inverted input signal INB via the tri-state buffers 501 and 503 are shut off to prevent an additional variation of the input signal IN from affecting the phase detector 500. A phase difference between the input signal IN and the clock signal CLK is outputted from the phase detector.

Figure 6:
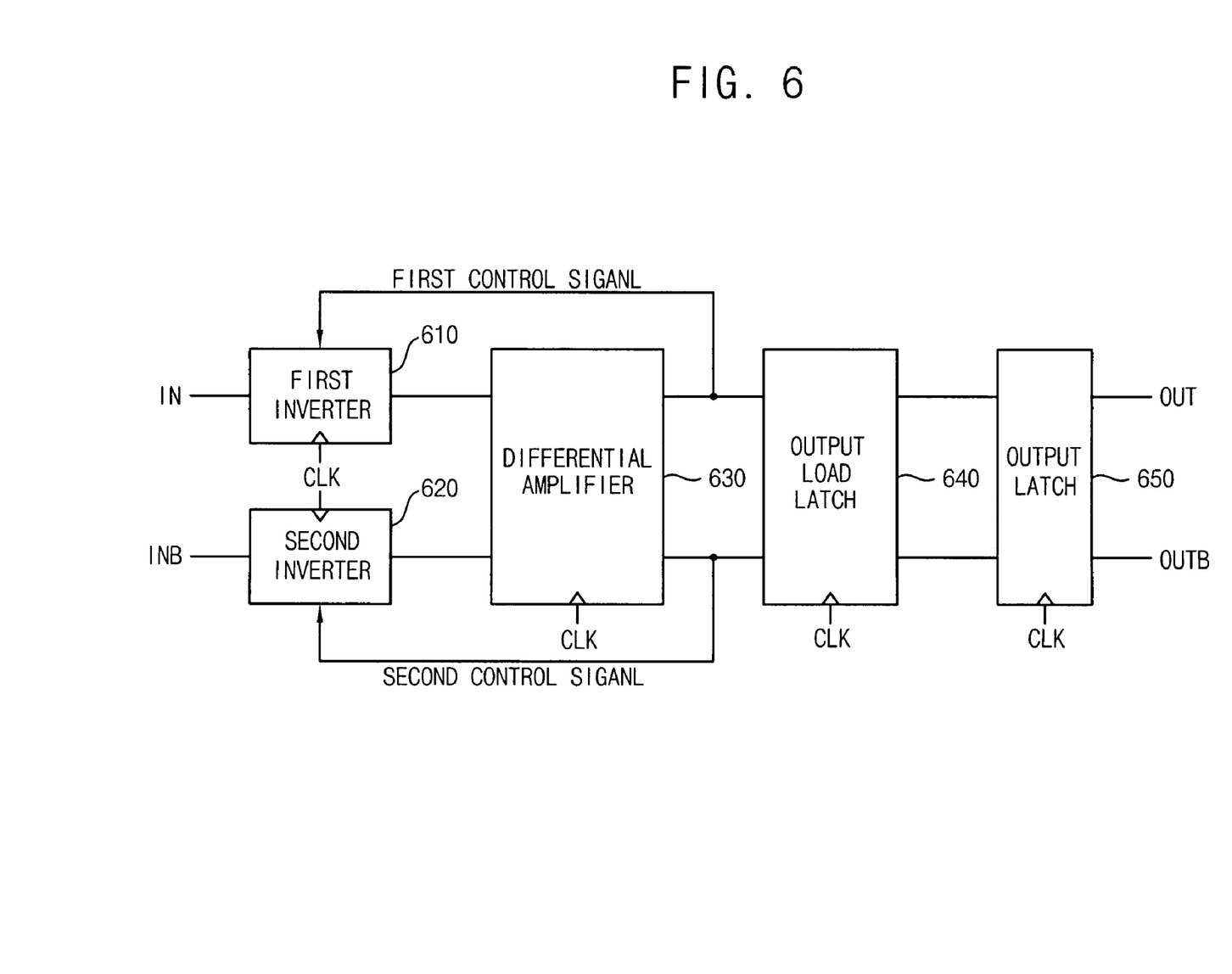
FIG. 6 is a block diagram illustrating a phase detector according to an exemplary embodiment of the present invention.

FIG. 6 is a block diagram illustrating a phase detector according to an exemplary embodiment of the present invention.

Referring to FIG. 6, the phase detector includes a first inverter 610, a second inverter 620, a differential amplifier 630, an output load latch 640 and an output latch 650.

The first inverter 610 receives the clock signal CLK, the input signal IN and a first control signal outputted from the differential amplifier 630 to provide a first differential input signal to the differential amplifier 630.

The second inverter 620 receives the clock signal CLK, the inverted input signal INB and a second control signal outputted from the differential amplifier 630 to provide a second differential input signal to the differential amplifier 630.

The differential amplifier 630 generates first and second differential output signals based on the received first and second differential input signals and provides the first and second differential output signals to the first and second inverters 610 and 620 as the first and second control signals, respectively.

The output load latch 640 latches the first and second differential output signals to generate a first and second latch output signals, wherein a potential difference therebetween is controlled based on the latched first and second differential output signals. The first and second latch output signals are outputted to the output latch 650.

The output latch 650 latches the received latch output signals to generate the phase detection signals OUT and OUTB.

Figure 7:
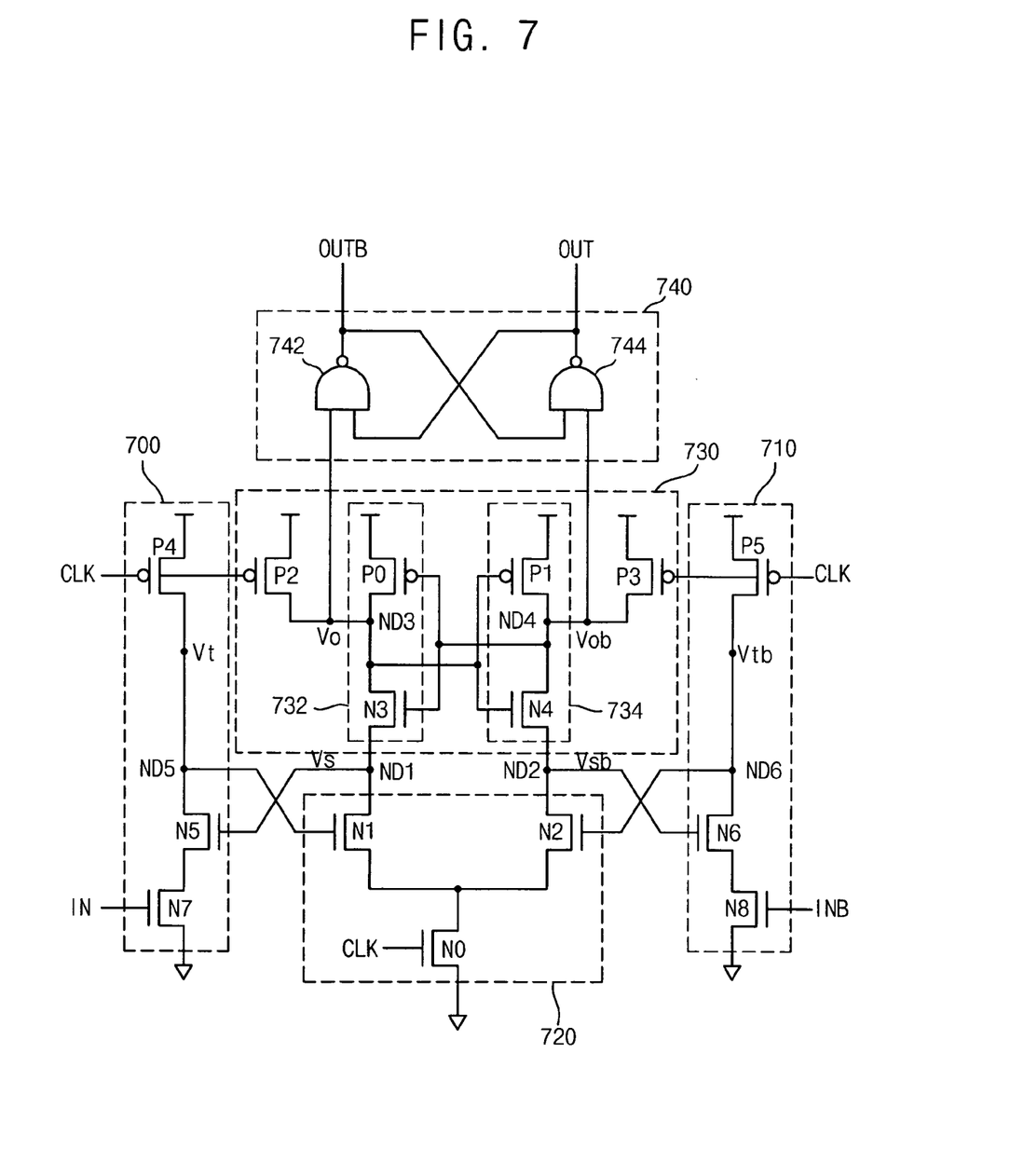
FIG. 7 is a circuit diagram illustrating a phase detector according to an exemplary embodiment of the present invention.

FIG. 7 is a detailed circuit diagram illustrating a phase detector according to an exemplary embodiment of the present invention.

Referring to FIG. 7, the phase detector may include a first inverter 700, a second inverter 710, a differential amplifier 720, an output load latch 730 and an output latch 740.

The first inverter 700 inverts the input signal IN based on the clock signal CLK having a first level and a first control signal Vs to generate a first differential input signal Vt. As the logic level of the clock signal CLK is changed to a second level, the transmission of the input signal IN to the first inverter 700 is shut off. In one embodiment, the first inverter 700 may include a PMOS transistor P4 and NMOS transistors N5 and N7 that are serially coupled to the PMOS transistor P4. The PMOS transistor P4 has a gate controlled by the clock signal CLK and the NMOS transistor N5 has a gate controlled by the first control signal Vs. The NMOS transistor N7 has a gate controlled by the input signal IN.

The second inverter 710 inverts the inverted input signal INB based on the clock signal CLK having a first level and a second control signal Vsb to generate a second differential input signal Vtb. The transmission of the inverted input signal INB to the second inverter 710 is shut off as the logic level of the clock signal CLK is changed to a second level. In one embodiment, the second inverter 710 may include a PMOS transistor P5 and NMOS transistors N6 and N8 that are serially coupled to the PMOS transistor P5. The PMOS transistor P5 has a gate controlled by the clock signal CLK and the NMOS transistor N6 has a gate controlled by the second control signal Vsb. The NMOS transistor N8 has a gate controlled by the inverted input signal INB.

The differential amplifier 720 generates a first and second differential output signals (Vs and Vsb) based on the first and second differential input signals Vt and Vtb and the clock signal CLK. The first and second differential output signals are provided to the first and second inverters 700 and 710 as the first and second control signals Vs and Vsb. In one embodiment, the differential amplifier 720 may include an NMOS transistor N1 whose gate is controlled by the first differential input signal Vt, an NMOS transistor N2 whose gate is controlled by the second differential input signal Vtb and an NMOS transistor N0 whose gate is controlled by the clock signal CLK. The NMOS transistor N0 is serially coupled to the NMOS transistors N1 and N2.

When the clock signal CLK has a logic high level, the differential amplifier 720 provides the first and second inverters 700 and 710 with the first and second control signals Vs and Vsb.

The output latch 730 latches the first and second differential output signals Vs and Vsb of the differential amplifier 720 in response to the clock signal CLK to generate first and second latch output signals Vo and Vob. In one embodiment, the output latch 730 may include PMOS transistors P2 and P3 whose gates are controlled by the clock signal CLK and first and second inverters 732 and 734. The first inverter 732 includes a PMOS transistor P0 and an NMOS transistor N3 serially coupled to the PMOS transistor P0. The second inverter 734 includes a PMOS transistor P1 and an NMOS transistor N4 serially coupled to the PMOS transistor P1.

The PMOS transistor P0 has a drain coupled to a drain of the PMOS transistor P2. Gates of the PMOS transistor P0 and the NMOS transistor N3 are controlled by the voltage Vob (the second latch output signal outputted from the second inverter 734) at a fourth node ND4. The PMOS transistor P1 has a drain coupled to a drain of the PMOS transistor P3. Gates of the PMOS transistor P1 and the NMOS transistor N4 are controlled by the voltage Vo (the first latch output signal outputted from the first inverter 732) at a third node ND3. That is, the first and second inverters 732 and 734 are cross-coupled to each other.

The output latch 740 includes NAND gates 742 and 744 that are cross-coupled to each other. The NAND gate 742 receives a logic level of the output voltage Vo at the third node ND3 and an output OUT of the NAND gate 744. In addition, the NAND gate 744 receives a logic level of the output voltage Vob at the fourth node ND4 and an output OUTB of the NAND gate 742.

Figure 8:
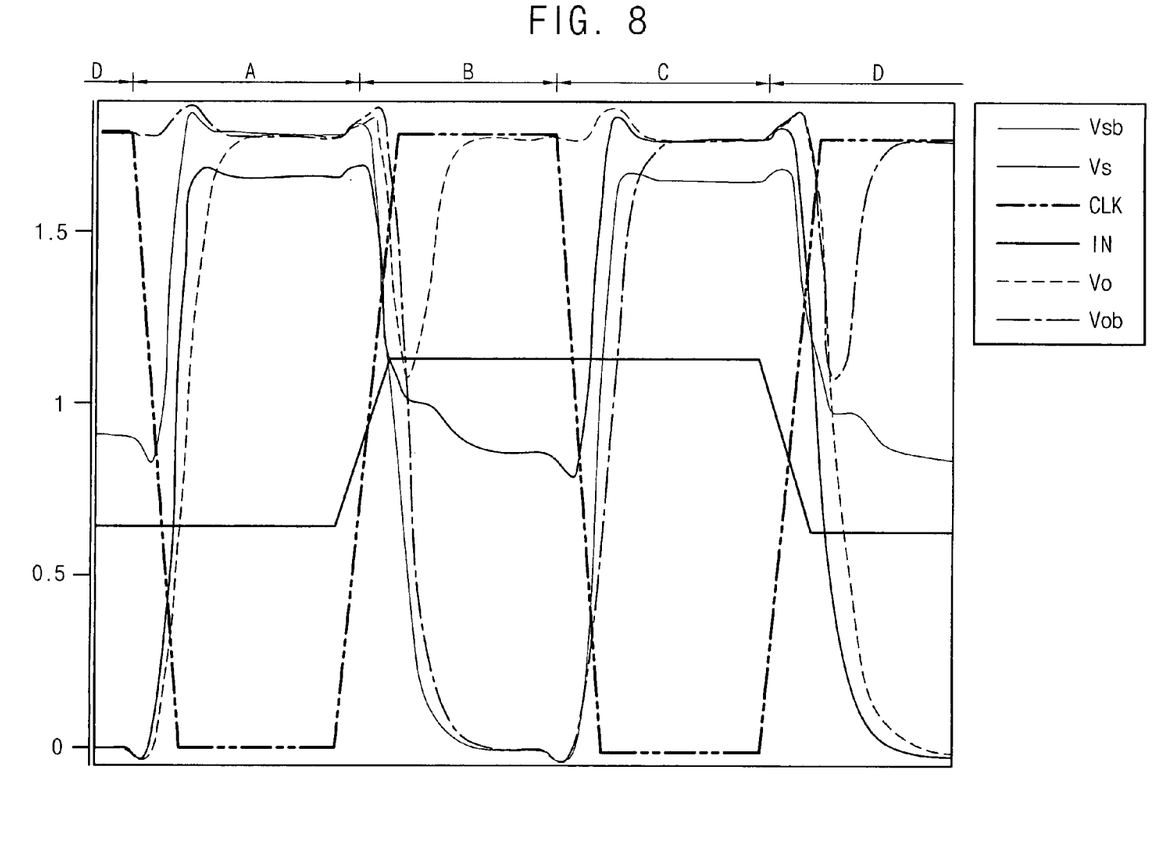
FIG. 8 is a graph showing a waveform that illustrates operation of the phase detector of FIG. 7.

FIG. 8 is a graph showing a waveform that illustrates operation of the phase detector of FIG. 7.

With reference to FIGS. 7 and 8, the operation of the phase detector of the present invention is described below.

Results of the output signals according to the variations in the input signal IN and the clock signal CLK are as follows.

At first, referring to a time interval "D" in FIG. 8, when the clock signal CLK has a logic high level and the input signal IN has a logic low level, the NMOS transistor N7 in FIG. 7 is turned off. Additionally, the NMOS transistor N8 is turned on since the inverted input signal INB has a logic high level. The PMOS transistors P2, P3, P4 and P5 are turned off by the clock signal CLK having a logic high level. Therefore, initial states of the voltages Vt, Vtb, Vo and Vob may be maintained as high potentials by the power supply voltage provided at the previous clock.

Accordingly, the NMOS transistors N1 and N2 of the differential amplifier 720 receiving the first and second differential input signals Vt and Vtb are turned on. Additionally, the NMOS transistors N3 and N4 of the first and second inverters 732 and 734 of the output load latch 730 are also turned on since the voltages Vo and Vob inputted to the output load latch 730 have high potentials. The NMOS transistor N0 is also turned on by the clock signal CLK having a logic high level.

Under the above conditions, the voltage Vsb at the second node ND2 is forced to a high voltage level by the voltage Vob having a high voltage potential, thereby turning on the NMOS transistor N6. In addition, the NMOS transistor N8 is turned on by the inverted input signal INB having a logic high level so that the voltage Vtb at the second node ND6 decreases to a low voltage potential.

When the voltage Vtb falls below a threshold voltage of the NMOS transistor N2, the NMOS transistor N2 is turned off and the voltage Vsb at the second node ND2 has a voltage level reduced from an initial voltage level. Similarly, the voltage level of the voltage Vob at the fourth node ND4 is lower than an initial voltage level thereof. However, both the voltages Vsb and the Vob still maintain logic high levels.

Similarly, the input signal IN having a logic low level causes the NMOS transistor N7 to turn off and the voltage Vs at the first node ND1 is forced to a high voltage level by the voltage Vo, thereby turning on the NMOS transistor N5. Therefore, the voltage Vt maintains a high voltage potential by the power supply voltage provided at a previous clock to turn on the NMOS transistor N1.

Additionally, the NMOS transistor N0 is caused to turn on by the clock signal CLK having a logic high level so that a current is constantly drawn from the NMOS transistor N0 and therefore, a voltage potential at the first node ND1 is gradually decreased. As a result, the voltage level of the voltage Vo may be decreased.

When the voltage Vo has a lower voltage level, the PMOS transistor P1 of the second inverter 734 receiving the voltage Vo as a control signal is turned on and the NMOS transistor N4 is turned off so that the voltage Vob may have a higher voltage potential by the power supply voltage coupled to the PMOS transistor P1.

The voltage levels of the first and second latch output signals Vo and Vob are provided to the output latch 740. The output latch 740 outputs the phase detection signal OUT having a logic low level and outputs the inverted phase detection signal OUTB having a logic high level. The above output logic values are preserved during a predetermined time period and are outputted at the next clock. This indicates that the transition of the clock signal CLK precedes the transition of the input signal IN.

That is, when the input signal IN transitions after the transition of the clock signal CLK, the inverted phase detection signal OUTB having a pulse width corresponding to the phase difference between the transitions of the input signal IN and the clock signal CLK is outputted, and a quantitative amount of the phase difference between the input signal IN and the clock signal CLK may be detected.

Next, referring to a time interval "B", when the clock signal CLK has a logic high level and the input signal IN has a logic high level, the NMOS transistor N7 is turned on. Additionally, the NMOS transistor N8 is turned off by the inverted input signal INB having a logic low level. Since the clock signal CLK has a logic high level, the PMOS transistors P2, P3, P4 and P5 are turned off. Therefore, the voltages Vt, Vtb, Vo and Vob have initial states maintaining high voltage potentials by the power supply voltage provided at the previous clock.

Accordingly, the NMOS transistors N1 and N2 are caused to turn on by the high voltage levels of the voltages Vt and Vtb. The NMOS transistors N3 and N4 are also caused to turn on by the voltages Vo and Vob having high voltage levels. The NMOS transistor N0 is also turned on by the clock signal CLK having a logic high level.

Under the above conditions, the NMOS transistor N6 is turned on by the voltage Vsb at the second node ND2 that is forced to a high voltage potential by the voltage Vob, while the NMOS transistor N8 is turned off by the inverted input signal INB having a logic low level.

In addition, the NMOS transistor N7 is turned on by the input signal IN having a logic high level so that the voltage Vt is decreased to have a logic low level. When the voltage Vt falls below a threshold voltage of the NMOS transistor N1, the NMOS transistor N1 is turned off so that the voltage Vs at the first node ND1 maintains at a predetermined voltage level. Although the voltage Vo is reduced from the initial voltage level, the voltage Vo maintains a logic high level.

Similarly, the inverted input signal INB having a logic low level causes the NMOS transistor N8 to turn off and the voltage Vsb at the second node ND2 is forced to a high voltage level by the voltage Vob, thereby turning off the NMOS transistor N6. The voltage Vtb maintains at a high voltage level by the power supply voltage provided at the previous clock, thereby turning on the NMOS transistor N2. The NMOS transistor N0 is also turned on by the clock signal CLK having a logic high level so that a current is constantly drawn from the NMOS transistor N0 and therefore, a voltage potential at the second node ND2 is gradually decreased. As a result, the voltage Vob may have a lower voltage potential.

When the voltage Vob has a low voltage potential, the PMOS transistor P0 of the first inverter 732 receiving the voltage Vob as a control signal is turned on and the NMOS transistor N3 is turned off so that the voltage Vo may have a higher voltage potential by the power supply voltage coupled to the PMOS transistor P0.

The voltage levels of the voltages Vo and Vob are provided to the output latch 740. The output latch 740 outputs the phase detection signal OUT having a logic high level and the inverted phase detection signal OUTB having a logic low level. The above output logic levels are preserved during a predetermined time period and outputted at the next clock. This means that the transition of the input signal IN precedes the transition of the clock signal CLK.

That is, when the clock signal CLK transitions after the transition of the input signal IN, the phase detection signal OUT having a pulse width corresponding to the phase difference between the transitions of the clock signal CLK and the input signal IN is outputted, and a quantitative amount of the phase difference therebetween may be detected.

Referring to time intervals "A" and "C", when the clock signal CLK has a logic low level, the PMOS transistors P2, P3, P4 and P5 are turned on and the NMOS transistor N0 is turned off. The voltages Vt, Vtb, Vo and Vob are forced to high voltage levels by the power supply voltage. Therefore, the NMOS transistor N3 of the first inverter 732 is turned on by the voltage Vob and the NMOS transistor N4 of the second inverter 734 is turned on by the voltage Vo. Accordingly, the voltages Vs and Vsb at the first and second nodes ND1 and ND2 have high voltage potentials so that the NMOS transistors N5 and N6 are turned on.

Under the above conditions, when the input signal IN has a logic high level (time interval "C"), the NMOS transistor N7 is turned to decrease the voltage level of the voltage Vt at the fifth node ND5. When the voltage Vt is lower than the threshold voltage of the NMOS transistor N1, the NMOS transistor N1 is turned off and the voltage Vs at the first node ND1 maintains a predetermined voltage level such that the voltage Vs has a high logic level. Accordingly, the voltage Vo may also have a high voltage level.

In addition, the inverted input signal INB has a logic low level to turn off the NMOS transistor N8. The voltage Vtb at the sixth node ND6 maintains the voltage level at the previous clock. Therefore, the NMOS transistors N2 and N6 are turned on while the NMOS transistor N0 is turned off by the clock signal CLK having a logic low level. The voltage Vsb has a voltage level lower than the voltage level of the voltage Vs, however, the voltage Vsb has a logic high level. Therefore, the voltage Vob also has a logic high level.

The voltage levels of the voltages Vo and Vob having logic high levels are concurrently provided to the NAND gates 742 and 744 of the output latch 740 and the phase detection signals OUT and OUTB having logic values at the previous clock is outputted from the output latch 740.

Additionally, when the clock signal CLK has a logic low level and the input signal IN has a logic low level (time interval "A"), the phase detection signals OUT and OUTB are generated in the same manner as in the time interval "C" where the input signal IN has a logic high level.

According to exemplary embodiments of the present invention, when a variation in the input signal is transmitted to the output signal, an additional variation in the input signal may be prevented so that an imprecise operation of the phase detector may be reduced.

Additionally, circuitry according to exemplary embodiments of the present invention may result in a reduced sensitivity to variations in manufacturing process and environment, when used in the delay locked loop (DLL), so that significant reduction in yield and degradation in performance may be avoided.

Also, an NMOS transistor that is selectively activated may be added to a transmit path of the input signal so that the input signal may not cause the variation in the output signal.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A circuit for detecting phase, comprising:
   a first inverter configured to invert an input signal in response to a clock signal and a first control signal to generate a first differential input signal and to shut off a transmission of the input signal;
   a second inverter configured to invert an inverted input signal in response to the clock signal and a second control signal to generate a second differential input signal and to shut off a transmission of the inverted input signal;
   a differential amplifier configured to differentially amplify the first and second differential input signals in response to the clock signal to provide first and second differential output signals as the first and second control signals;

an output load latch configured to latch the first and second differential output signals to generate the first and second latch output signals; and an output latch configured to latch the first and second latch output signals to output a phase detection signal.

2. The circuit of claim 1, wherein the first inverter inverts the input signal when the clock signal has a first level to provide the first differential input signal to the differential amplifier, and the first inverter provides the first differential input signal having a predetermined level at a previous clock and shuts off the transmission of the input signal when the clock signal has a second level.

3. The circuit of claim 2, wherein the first inverter includes:
  a first PMOS transistor that is activated in response to the first level of the clock signal;
  a first NMOS transistor serially coupled to the first PMOS transistor that is activated in response to the first control signal; and
  a second NMOS transistor serially coupled to the first NMOS transistor that is activated in response to the input signal.

4. The circuit of claim 3, wherein the first differential input signal corresponds to a voltage level at a node coupled between the first PMOS transistor and the first NMOS transistor.

5. The circuit of claim 1, wherein the second inverter inverts the inverted input signal based on the clock signal having a first level and the second control signal to provide the second differential input signal to the differential amplifier, and the second inverter provides the second differential input signal having a predetermined level at a previous clock and shuts off the transmission of the inverted input signal when the clock signal has a second level.

6. The circuit of claim 5, wherein the second inverter includes:
  a second PMOS transistor that is activated in response to the first level of the clock signal;
  a third NMOS transistor serially coupled to the second PMOS transistor that is activated in response to the second control signal; and
  a fourth NMOS transistor serially coupled to the third NMOS transistor that is activated in response to the inverted input signal.

7. The circuit of claim 6, wherein the second differential input signal corresponds to a voltage level at a node coupled between the second PMOS transistor and the third NMOS transistor.

8. The circuit of claim 1, wherein the differential amplifier includes a bias current source that is activated in response to a first level of the clock signal.

9. The circuit of claim 1, wherein the output load latch includes a first CMOS inverter and a second CMOS inverter cross coupled to the first CMOS inverter.

10. The circuit of claim 1, wherein the output latch includes a first NAND gate and a second NAND gate cross coupled to the first NAND gate.

11. A method of detecting phase, comprising:
  inverting an input signal in response to a clock signal and a first control signal to generate a first differential input signal and shutting off a transmission of the input signal;
  inverting an inverted input signal in response to the clock signal and a second control signal to generate a second differential input signal and shutting off a transmission of the inverted signal;
  differentially amplifying the first and second differential input signals in response to the clock signal to provide first and second differential output signals as the first and second control signals;
  latching the first and second differential output signals to generate the first and second latch output signals; and
  latching the first and second latch output signals to output a phase detection signal.

12. The method of claim 11, wherein the inverting an input signal includes:
  inverting the input signal in response to the clock signal having a first level to provide the first differential input signal; and
  providing the first differential input signal having a predetermined level at a previous clock and shutting off the transmission of the input signal in response to the clock signal having a second level.

13. The method of claim 11, wherein the inverting an inverted input signal includes:
  inverting the inverted input signal in response to the clock signal having a first level to provide the second differential input signal; and
  providing the second differential input signal having a predetermined level at a previous clock and shutting off the transmission of the inverted input signal in response to the clock signal having a second level.

14. The method of claim 11, wherein the differentially amplifying the first and second differential input signals includes:
  providing the first and second differential output signals as the first and second control signals when the clock signal has a first level; and
  providing the first and second differential output signals having inactive states as the first and second control signals when the clock signal has a second level.

15. The method of claim 11, wherein the latching the first and second differential output signals includes providing the first latch output signal as an input signal for generating the second latch output signal and providing the second latch output signal as an input signal for generating the first latch output signal in response to the clock signal.

16. The method of claim 11, wherein the latching the first and second latch output signals to output a phase detection signal includes:
  performing a logical operation on the first latch output signal and the phase detection signal to generate an inverted phase detection signal; and
  performing a logical operation on the second latch output signal and the inverted phase detection signal to generate the phase detection signal.

* * * * *